United States Patent
Hente et al.

(10) Patent No.: US 9,312,314 B2
(45) Date of Patent: Apr. 12, 2016

(54) LIGHT APPARATUS FOR GENERATING LIGHT

(71) Applicant: OLEDWORKS GMBH, Aachen (DE)

(72) Inventors: Dirk Hente, Aachen (DE); Holger Spahr, Braunschweig (DE); Sami Hamwi, Braunschweig (DE); Alexander Rohr, Braunschweig (DE); Wolfgang Kowalsky, Braunschweig (DE); Torsten Rabe, Braunschweig (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/373,369

(22) PCT Filed: Jan. 18, 2013

(86) PCT No.: PCT/IB2013/050470
§ 371 (c)(1),
(2) Date: Jul. 21, 2014

(87) PCT Pub. No.: WO2013/114244
PCT Pub. Date: Aug. 8, 2013

(65) Prior Publication Data
US 2014/0339530 A1  Nov. 20, 2014

Related U.S. Application Data

(60) Provisional application No. 61/593,887, filed on Feb. 2, 2012.

(51) Int. Cl.
*H01L 27/32* (2006.01)
*H01L 49/02* (2006.01)
(Continued)

(52) U.S. Cl.
CPC ............ *H01L 27/3225* (2013.01); *H01L 28/20* (2013.01); *H01L 28/40* (2013.01);
(Continued)

(58) Field of Classification Search
CPC . H01L 27/3225; H01L 51/56; H01L 51/5256; H01L 28/40; H01L 28/20
See application file for complete search history.

(56) References Cited

U.S. PATENT DOCUMENTS 6,816,358 B2 * 11/2004 Kida et al. .................... 361/540
7,319,599 B2 *  1/2008 Hirano et al. ................ 361/763
(Continued)

FOREIGN PATENT DOCUMENTS

| | | |
|---|---|---|
| CN | 101937285 A | 1/2011 |
| JP | 2004342885 A | 12/2004 |

(Continued)

OTHER PUBLICATIONS

"High Density MIM Capacitors Using AL2O3 and AiTiOx Dielectrics" Chen et al, IEEE Electron Device Letters, vol. 23, No. 4, Apr. 2002 p. 185-187.

(Continued)

*Primary Examiner* — Ida M Soward

(57) ABSTRACT

The invention relates to a light apparatus (1) for generating light. The light apparatus includes a light emission structure (2) including light emission material (9), a capacitor structure (3) including at least two capacitor electrode films (11, 12) and a dielectric film (14) between the capacitor electrode films, and a film encapsulation (30) including at least one film for encapsulating and thereby protecting at least the light emission material. The capacitor structure is integrated in the light apparatus such that the capacitor electrode films and the dielectric film are at least partly arranged in parallel to the light emission structure. Since films, in particular, thin films, are used for the capacitor structure and the encapsulation and since the capacitor structure is integrated in the light apparatus, the light apparatus can be relatively thin.

12 Claims, 8 Drawing Sheets

(51) Int. Cl.
*H01L 51/52* (2006.01)
*H01L 51/56* (2006.01)

(52) U.S. Cl.
CPC ........ *H01L51/5253* (2013.01); *H01L 51/5256* (2013.01); *H01L 51/56* (2013.01); *H01L 27/3204* (2013.01); *H01L 51/5262* (2013.01); *H01L 2251/5361* (2013.01)

(56) References Cited

U.S. PATENT DOCUMENTS

| | | | | |
|---|---|---|---|---|
| 8,749,161 | B2* | 6/2014 | Nerone et al. | 315/291 |
| 2002/0060654 | A1* | 5/2002 | Park et al. | 345/76 |
| 2009/0217521 | A1 | 9/2009 | Yang | |
| 2010/0270924 | A1 | 10/2010 | Kaminska | |
| 2011/0050604 | A1 | 3/2011 | Kwon et al. | |
| 2011/0121723 | A1* | 5/2011 | Chen et al. | 313/509 |
| 2011/0234097 | A1* | 9/2011 | Radermacher | 315/53 |
| 2012/0098422 | A1* | 4/2012 | Jung et al. | 313/512 |
| 2012/0146493 | A1* | 6/2012 | Ra | 313/512 |

FOREIGN PATENT DOCUMENTS

| | | |
|---|---|---|
| KR | 2009088286 A | 8/2009 |
| WO | 2010125493 A1 | 11/2010 |

OTHER PUBLICATIONS

"Reliable Thin Film Encapuslation for Organic Light Emitting Diodes Grown by Low-Temperature Atomic Layer Deposition" Meyer et al, Applied Physics Letters 94, 2009.

\* cited by examiner

LIGHT APPARATUS FOR GENERATING LIGHT

CROSS-REFERENCE TO PRIOR APPLICATIONS

This application is the U.S. National Phase application under 35 U.S.C. §371 of International Application No. PCT/IB2012/050470, filed on Jan. 18, 2013, which claims the benefit of U.S. Patent Application No. 61/593,887, filed on Feb. 2, 2012. These applications are hereby incorporated by reference herein.

FIELD OF THE INVENTION

The invention relates to a light apparatus and a light method for generating light. The invention relates further to a manufacturing apparatus and a manufacturing method for manufacturing the light apparatus.

BACKGROUND OF THE INVENTION

An organic light emitting diode (OLED) apparatus generally requires a converter for converting mains energy into a form as required by the OLED apparatus. The converting means comprises a capacitor for delivering energy during time phases, in which the mains voltage is lower than the voltage required by the OLED apparatus, in order to reduce perceptible light flicker that may be caused by a periodic temporal variation of the mains energy and the fast electrical time constant of the OLED apparatus. The capacitor is relatively bulky making the overall OLED apparatus relatively large.

SUMMARY OF THE INVENTION

It is an object of the present invention to provide a light apparatus for generating light, which can be less bulky. It is a further object of the present invention to provide a corresponding light method for generating light, and to provide a manufacturing apparatus and a manufacturing method for manufacturing the light apparatus.

In a first aspect of the present invention a light apparatus for generating light is presented, wherein the light apparatus comprises:
- a light emission structure including at least two light emission electrodes and a light emission material arranged between the light emission electrodes, wherein the light emission material is adapted, to emit light, if a voltage is applied to the light emission electrodes,
- a capacitor structure including at least two capacitor electrode films and a dielectric film between the capacitor electrode films, the capacitor structure being integrated in the light apparatus such that the capacitor electrode films and the dielectric film are at least partly arranged in parallel to the light emission structure, and
- a film encapsulation comprising at least one film, wherein the at least one film encapsulates at least the light emission material for protecting at least the light emission material.

Since the capacitor structure includes at least two capacitor electrode films and a dielectric film between the capacitor electrode films, the capacitor structure can be relatively thin. Moreover, since the encapsulation is a film encapsulation comprising at least one film for encapsulating at least the light emission material for protecting at least the light emission material preferentially against moisture and/or oxygen, also the film encapsulation can be relatively thin. For these reasons and since the relatively thin capacitor structure is integrated in the light apparatus such that the capacitor electrode films and the dielectric film are at least partly arranged in parallel to the light emission structure, the light apparatus can be less bulky.

That the capacitor electrode films and the dielectric film are at least partly arranged in parallel to the light emission structure preferentially means that the capacitor electrode films and the dielectric film can cover the whole area of the light emission structure or only a part of the light emission structure.

The capacitor structure can be integrated in the film encapsulation such that the capacitor structure is formed by films of the film encapsulation. In particular, films of the film encapsulation can form the capacitor electrode films and the dielectric film. This can further increase the compactness of the resulting light apparatus. Moreover, the capacitor structure and the film encapsulation can be manufactured by similar methods and, thus, by similar manufacturing elements, thereby simplifying the manufacturing of the light apparatus.

The film encapsulation with the integrated capacitor structure can be a thin film encapsulation (TFE), wherein the different films of the film encapsulation and, thus, the films of the capacitor structure can have a thickness of about 100 nm. Preferentially, the thin film encapsulation is configured such that a further protection against, for instance, moisture and oxygen, which may be provided by an additional glass plate or foil, is not needed and therefore preferentially not present.

The light apparatus is preferentially an OLED light apparatus, wherein the light emission material comprises organic material.

The term "light emission electrodes" is used for indicating that these electrodes are used for applying a voltage to the light emission material such that the light emission material emits light.

The capacitor electrode films are preferentially thin films having a thickness of about 100 nm. They can comprise metal and/or a transparent conductive oxide (TCO). The dielectric film is preferentially insulating. It preferentially comprises at least one of an oxide and a nitride. In particular, the dielectric film can comprise an anorganic oxide. For example, the dielectric film can comprise at least one of $Al_2O_3$, $AlTiO_x$ and $ZrO_2$. In an embodiment, the dielectric film is a nanolaminate, wherein it may comprise a changing order of $Al_2O_3$ and $ZrO_2$. The dielectric film may be deposited by atomic layer deposition (ALD).

The capacitor structure can be electrically connected to the light emission structure, or it can be electrically separated from the light emission structure, wherein the light emission structure and the capacitor structure are preferentially integrated in a single integrated unit emitting the light.

The film encapsulation preferentially comprises a first moisture and oxygen barrier for protecting the light emission structure against moisture and oxygen. The first moisture and oxygen layer is preferentially located between the light emission structure and the capacitor structure. In a preferred embodiment, the first moisture and oxygen barrier and the dielectric film are made of the same material. This allows producing the first moisture and oxygen barrier and the dielectric film by using the same or similar manufacturing units and manufacturing techniques, thereby simplifying the manufacturing of the light apparatus.

The film encapsulation preferentially further comprises a second moisture and oxygen barrier for protecting at least the capacitor structure against moisture and oxygen. Also the second moisture, and oxygen barrier and the dielectric film may be made of the same material, in particular, if the capacitor structure and the light emission structure are electrically connected.

Since the same material may be used for forming the dielectric film of the capacitor structure and for providing a protection against moisture and oxygen, also the moisture and oxygen barriers can be dielectric films, in particular, thin dielectric films of about 100 nm. In an embodiment, also the moisture and oxygen barriers are nanolaminates.

In a preferred embodiment, the light apparatus further comprises a resistor electrically connected to the light emitting structure and to the capacitor structure. The resistor may be a resistive layer arranged on the second moisture and oxygen layer.

It is preferred that the capacitor structure is adapted to influence the emitted light. In particular, the capacitor structure can be at least partly transparent to the emitted light, wherein the light apparatus is adapted such that the emitted light traverses at least a part of the transparent capacitor structure before leaving the light apparatus. For instance, the light apparatus can be a top emitting light apparatus having a top light emission electrode being at least partly transparent to the emitted light, wherein the capacitor structure is located on top of the light emission structure and wherein the capacitor structure is at least partly transparent to the emitted light for allowing the light to leave the light apparatus through the capacitor structure, whereby the capacitor structure influences the light. Moreover, the light apparatus can be a bottom emitting light apparatus having a bottom light emission electrode being at least partly transparent to the emitted light, wherein the light emission structure is located on top of the capacitor structure and wherein the capacitor structure is at least partly transparent to the emitted light for allowing the light to leave the light apparatus through the capacitor structure, whereby the capacitor structure influences the light. In a further example, the light apparatus is a top emitting light apparatus having a top light emission electrode being at least partly transparent to the emitted light, wherein the light emission structure is located on top of the capacitor structure, wherein a bottom capacitor electrode is adapted to reflect the emitted light towards the top of the light apparatus and wherein the capacitor structure is at least partly transparent to the emitted light above the bottom capacitor electrode. Thus, the outcoupling of the light can be influenced, without necessarily needing a further outcoupling structure. This can lead to a further reduction of the dimensions of the light apparatus.

In an embodiment, at least one of a) at least one of the capacitor electrode films and b) the dielectric film is structured for influencing the light. In particular, one or several capacitor electrode films and/or one or several dielectric films may not be plane. For instance, they can be curled, or they can consist of particles embedded in a matrix system.

The light apparatus can comprise a substrate coated with a conductive material forming a first one of the at least two light emission electrodes. The substrate can be a solid substrate like glass or a flexible substrate like a polymer foil. The coated conductive material is preferentially a TCO like indium tin oxide (ITO) or aluminum doped zinc oxide (AZO). The conductive material can be regarded as forming a ground light emission electrode of an OLED. On top of the ground light emission electrode the light emission material can be provided, on which a conductive material like metal or a TCO can be applied for forming the opposing light emission electrode.

In a further aspect of the present invention a light method for generating light by using the light apparatus is presented, wherein the light method comprises a) applying voltage to the light emission material arranged between the at least two light emission electrodes via the light emission electrodes, wherein the capacitor structure including the at least two capacitor electrode films and the dielectric film between the capacitor electrode films reduces possible fluctuations of the applied voltage, wherein the capacitor structure is integrated in the light apparatus such that the capacitor electrode films and the dielectric film are at least partly arranged in parallel to the light emission structure and wherein at least the light emission material is encapsulated by the at least one film for providing the film encapsulation protecting at least the light emission material, and b) emitting light by the light emission material in response to the applied voltage.

In a further aspect of the present invention a manufacturing method for manufacturing a light apparatus for generating light is presented, wherein the manufacturing method comprises a) providing a light emission structure including at least two light emission electrodes and a light emission material arranged between the light emission electrodes, wherein the light emission material is adapted to emit light, if a voltage is applied to the light emission electrodes, b) providing a capacitor structure including at least two capacitor electrode films and a dielectric film between the capacitor electrode films, wherein the capacitor structure is integrated in the light apparatus such that the capacitor electrode films and the dielectric film are at least partly arranged in parallel to the light emission structure, c) encapsulating at least the light emission material by at least one film for providing a film encapsulation protecting at least the light emission material. In an embodiment, steps b) and c) are performed in an integrated way, wherein with depositing films of the film encapsulating also films of the capacitor structure are deposited, in order to form a film encapsulation with an integrated capacitor structure. The dielectric film can be provided by at least one of the following techniques: ALD, plasma enhanced ALD, chemical vapor deposition (CVD), plasma enhanced CVD (PECVD), sputtering, phase vapor deposition (PVD).

In a further aspect of the present invention a manufacturing apparatus for manufacturing a light apparatus for generating light is presented, wherein the manufacturing apparatus comprises a) a light emission structure providing unit for providing a light emission structure including at least two light, emission electrodes and a light emission material arranged between the light emission electrodes, wherein the light emission material is adapted to emit light, if a voltage is applied to the light emission electrodes, b) a capacitor structure providing unit for providing a capacitor structure including at least two capacitor electrode films and a dielectric film between the capacitor electrode films, wherein the capacitor structure providing unit is adapted to integrate the capacitor structure in the light apparatus such that the capacitor electrode films and the dielectric film are at least partly arranged in parallel to the light emission structure, and c) a film encapsulation providing unit for providing a film encapsulation comprising at least one film for encapsulating at least the light emission material for protecting at least the light emission material. The capacitor structure providing unit and the film encapsulation providing unit can form a single integrated unit for providing an integrated capacitor structure and film encapsulation structure, wherein this integrated structure preferentially forms a thin film encapsulation for protecting at least the light emission material against, for instance, moisture and oxygen.

It shall be understood that the light apparatus of claim 1, the light method of claim 12, the manufacturing method of claim 13 and the manufacturing apparatus of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
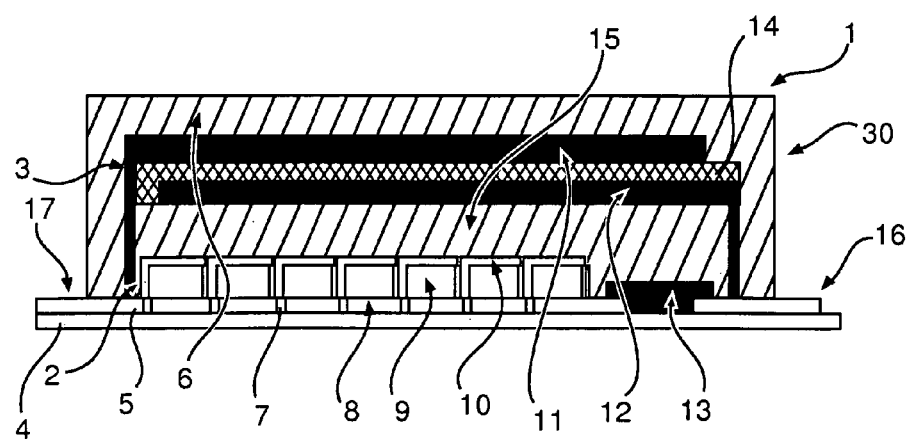
FIG. 1 shows schematically and exemplarily an embodiment of a light apparatus for generating light, wherein the light apparatus is a bottom-emitting light apparatus.

FIG. 1 shows schematically and exemplarily a light apparatus 1 for generating light. The light apparatus 1 is, in this embodiment, an OLED light apparatus comprising a light emission structure 2, a capacitor structure 3 and a film encapsulation 30, wherein the capacitor structure 3 is integrated in the film encapsulation 30. The light emission structure 2 includes several pairs of light emission electrodes 8, 10, wherein between the light emission electrodes 8, 10 a light emission material 9 is arranged. The light emission material 9 is adapted to emit light, if a voltage is applied to the light emission electrodes 8, 10. The light emission material 9 comprises organic material emitting the light.

The capacitor structure 3 includes two capacitor electrode films 11, 12 and a dielectric film 14 between the capacitor electrode films. The capacitor structure 3 is integrated in the light apparatus 1 such that the capacitor electrode films 11, 12 and the dielectric film 14 are arranged in parallel to the light emission structure. The capacitor electrode films 11, 12 and the dielectric film 14 are thin films having a thickness of about 100 nm. The capacitor electrode films can comprise metal and/or a transparent conductive oxide. The dielectric film is preferentially insulating and comprises at least one of an oxide or a nitride. In particular, the dielectric film 14 can comprise an anorganic oxide. For example, the dielectric film 14 can comprise at least one of $Al_2O_3$, $AlTiO_x$ and $ZrO_2$. It is preferentially a nano laminate comprising a changing order of different oxides and/or nitrides. For instance, the dielectric film 14 can comprise a changing order of $Al_2O_3$ and $ZrO_2$. The light emission structure 2 and the capacitor structure 3 are integrated in a single integrated unit emitting the light, wherein, in this embodiment, the light emission structure 2 and the capacitor structure 3, are electrically connected.

The film encapsulation 30 is a thin film encapsulation comprising a first moisture and oxygen barrier 15 for protecting the light emission structure 2 against moisture and oxygen. The first moisture and oxygen barrier 15 is located between the light emission structure 2 and the capacitor structure 3. The first moisture and oxygen barrier 15 and the dielectric film 14 between the capacitor electrode films 11, 12 are made of the same material.

The film encapsulation 30, i.e. in this embodiment the thin film encapsulation, further comprises a second moisture and oxygen barrier 6 for protecting at least the capacitor structure 3 against moisture and oxygen. In this embodiment, also the second moisture and oxygen barrier and the dielectric film are made of the same material. Thus, the same material can be used for forming the dielectric film 14 of the capacitor structure 3 and for providing a protection against moisture and oxygen. In particular, also the moisture and oxygen barriers can be dielectric films, in particular, thin dielectric films of about 100 nm, and they can also be nano laminates.

The light apparatus 1 further comprises a resistor 13 being, in this embodiment, a TCO resistor and being electrically connected to the light emitting structure 2 and to the capacitor structure 3.

In the orientation shown in FIG. 1, each pair of light emission electrodes consists of a bottom light emission electrode and a top light emission electrode. The light apparatus 1 comprises a substrate 4 coated with a structured conductive layer 5 being, in this embodiment, an ITO layer. The structured conductive layer 5 provides the bottom light emission electrodes 8, which are separated by passive elements 7, and contact pads 16, 17 for contacting the light apparatus 1 to a voltage source. The top light emission electrodes 10 can comprise metal like silver or copper. The electrical circuit of the light apparatus 1 shown in FIG. 1 can be illustrated by the equivalent circuit schematically and exemplarily shown in FIG. 2.

Figure 2:
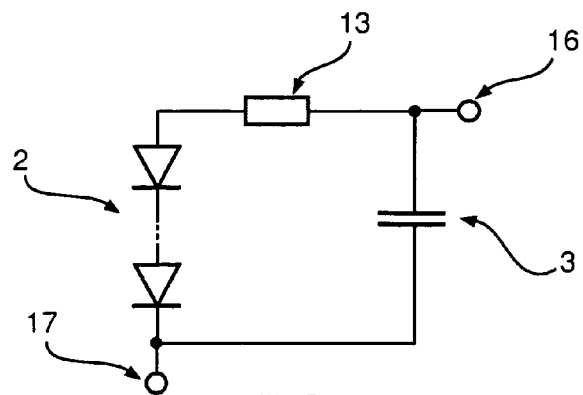
FIG. 2 shows schematically and exemplarily an equivalent circuit of the light apparatus shown in FIG. 1.

As can be seen in FIG. 2, the pairs of top and bottom light emission electrodes are connected in series, thereby forming the light emission structure 2. The resistor 13 is connected in series with the light emission structure 2 and the capacitor structure 3 is connected in parallel to the light emission structure 2.

In this embodiment, the first moisture and oxygen barrier 15 is part of the thin film encapsulation 30 deposited on the light emission structure 2. If during manufacturing the light apparatus 1 the thin film encapsulation 30 is deposited, this deposition of the thin film encapsulation is performed such that the bottom and top light emission electrodes 8, 10 are still connectable by contacting corresponding contact pads 16, 17.

During manufacturing the light apparatus 1 on top of the first moisture and oxygen barrier 15 a conductive layer is deposited, which, can comprise, for instance, metal or a transparent conductive oxide and which forms the capacitor electrode film 12. The deposition process can be, for instance, vacuum evaporation, sputtering, plasma enhanced laser deposition, or atomic layer deposition. The conductive layer 12 on the first moisture and oxygen barrier 15 contacts the top electrode contact pad 16 and forms a first plate of the capacitor structure 3, i.e. forms a first capacitor electrode film, placed directly onto the first moisture and oxygen barrier 15. The bottom electrode pads of the light emission structure 2 and the capacitor structure 3 are left unconnected, i.e. the pairs of light emission electrodes sandwiching a respective light emission material form OLEDs which are connected in series, wherein the respective bottom electrode 8 is connected with the top electrode of the respective neighboring OLED and wherein, for instance, the contact pad 17 is connected with the top electrode of the first OLED, but is still not connected with the capacitor structure 3 after the deposition of the first capacitor electrode film 12.

On top of the conductive layer forming, in this embodiment, the bottom capacitor electrode film 12, another thin film can be deposited for forming the dielectric film 14, wherein the electrode ports, i.e. the contact pads 16, 17, are still kept uncoated for further connection with the additional capacitor plate, i.e. with the additional capacitor electrode film 11.

Moreover, in this embodiment, a second conducting layer consisting of metal or a transparent conducting oxide, is deposited on the dielectric layer 14 for forming the top capacitor electrode film 11. In other embodiments, the alternating deposition of a dielectric layer and a conducting layer can be performed several times, in order to generate a capacitor structure having a desired capacitance. Finally, the capacitor structure is protected by a final thin film forming the second moisture and oxygen barrier 6.

Depending on the specific application, the OLEDs, i.e. the pairs of light emission electrodes sandwiching the respective light emission material, can be designed as bottom or top emitting light sources as well as transparent devices emitting in both directions. The several films above the light emission structure 2, in particular, the films of the capacitor structure 3 and the moisture and oxygen barriers 15, 16 form the film encapsulation 30 for encapsulating the light emission structure and the capacitor structure.

In the light apparatus 1 the thin film based capacitor structure 3 is integrated in the thin film encapsulation of the OLED stack, i.e. in the thin film encapsulation of the light emission structure 2, in order to work as electric filter element. However, the capacitor structure can be adapted to influence the emitted light such that the capacitor structure does not only work as an electric filter, but does also have the function of concomitantly improving or at least modifying the light outcoupling.

In particular, the light apparatus 1 shown in FIG. 1 can be adapted such that it is a top emitting light apparatus, wherein the capacitor structure 3 is located on top of the light emission structure 2, wherein the capacitor structure 3 is at least partly transparent to the emitted light for allowing the light to leave the light apparatus 1 through the capacitor structure 3, whereby the capacitor structure influences the light. In this case the top light emission electrodes are at least partly transparent to the emitted light and the bottom light emission electrodes are opaque. Thus, the light apparatus 1 shown in FIG. 1 can comprise top emitting OLEDs connected in series and comprising an opaque bottom light emission electrode 8, a multilayer OLED stack consisting of organic and inorganic materials forming the light emission material 9, and a transparent top light emission electrode 10, which may be completely transparent or semi-transparent. The OLEDs are connected with a thin film based resistor 13 in series and are encapsulated by the thin film 15 being, in this embodiment, transparent. On top of this thin film 15 forming the moisture and oxygen barrier, in this embodiment, a transparent thin film based capacitor forming the capacitor structure 3 is deposited. Alternatively, the capacitor structure can be segmented in two sub-units, which can be connected in parallel or in series to increase the capacitance or breakdown voltage, respectively. The capacitor structure 3 consists of the dielectric film 14 and the capacitor electrode films 11, 12, wherein, in this example, the dielectric film 14 is transparent and also the capacitor electrode films are semi-transparent or completely transparent as realized by transparent conductive oxides or multilayer electrodes with ultra thin metal layers, in order to have an impact on the optical characteristics of the OLEDs. In this example, also the thin film 6 on top of the capacitor structure 3 is transparent. The respective effect on the light emission depends on both, the OLED stack, i.e. the light emission structure 2, and the thin film encapsulation 30 with the integrated capacitor structure 3 and can be attributed to micro-cavity and wave-guiding effects. The same holds true for transparent OLED devices realized by making the bottom light emission electrode transparent like the top light emission electrode. In this case, the thin film based capacitor structure 3 determines the fraction of light emitted through the top light emission electrode compared to the light emitted through the bottom light emission electrode. The light emission can therefore be directed to a certain extent into one half-space of the transparent device.

Figure 3:
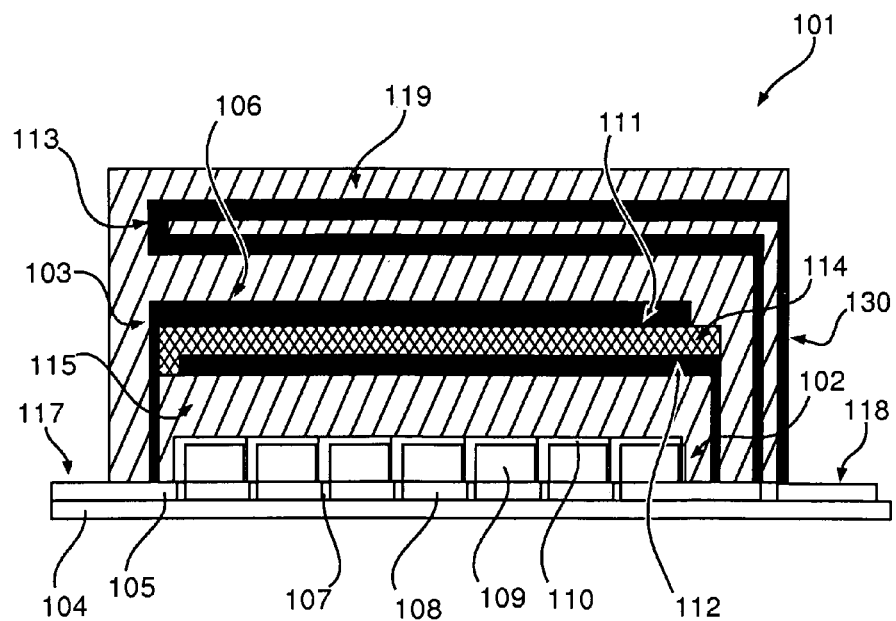
FIG. 3 shows schematically and exemplarily a further embodiment of a bottom-emitting light apparatus, wherein a resistor is arranged on top of a capacitor structure.

FIG. 3 shows schematically and exemplarily a further embodiment of a light apparatus. The light apparatus 101 shown in FIG. 3 is similar to the light apparatus 1 shown in FIG. 1, except for the resistor. Thus, also the light apparatus 101 comprises a substrate 104 coated with an ITO layer 105, which is structured to form the bottom light emission electrodes 108. Moreover, also the light apparatus 101 comprises top light emission electrodes 110, light emission material 109, passive elements 107, a first moisture and oxygen barrier 115, a capacitor structure 103 with capacitor plates, i.e. capacitor electrode films, 111, 112 and a dielectric film 114, and a second moisture and oxygen barrier 106. However, on top of the second moisture and oxygen barrier 106 resistive layers 113 are provided, which are covered by a third moisture and oxygen barrier 119, which is preferentially also a thin film comprising the dielectric material for protecting against moisture and oxygen. The resistor 113 can be a transparent conductive oxide resistor, which can be electrically connected via a contact pad 118.

Figure 4:
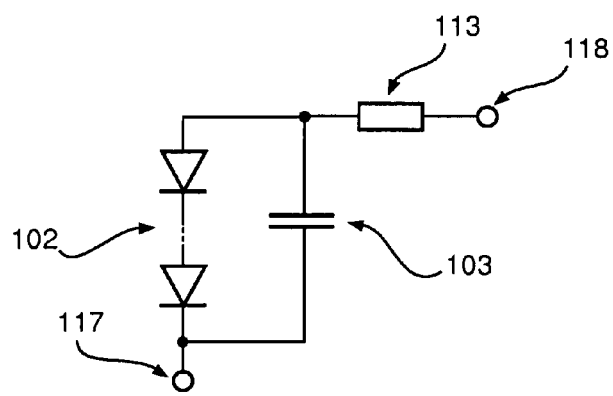
FIG. 4 shows schematically and exemplarily an equivalent circuit of the light apparatus shown in FIG. 3.

FIG. 4 shows schematically and exemplarily an equivalent circuit of the light apparatus 101 shown in FIG. 3. As can be seen in FIG. 4, the light emission structure 102 is parallel to the capacitor structure 103 and the resistor 113 is in series with the light emission structure 102 and the capacitor structure 103, wherein the light apparatus 101 can be contacted via contact pads 117, 118.

Thus, onto the thin film 106, another conductive but resistive material is deposited to act as a charging resistor for the parallel circuit of the OLEDs, i.e. of the light emission structure 102, and the capacitor structure 103. Therefore, the charging resistor 113 is connected to an extra port, i.e. to the resistor contact pad 118, not belonging to the rest of the whole circuit. The combination of the charging resistor 113 in series circuit with the parallel circuit of the light emission structure 102 and the capacitor structure 103 generates a low-pass filter to smooth signals coming to the parallel circuit. By choice of material and resistive material thickness, the charging resistor 113 can be set up as desired. Such kind of low pass filter is preferentially used, for example, for OLEDs, which are designed for a direct mains connection utilizing resistive ballast. In addition to the third oxygen and moisture barrier 119 being a gas protection provided by the thin film, the light apparatus can further be covered by, for instance, a scratch protection made of, for example, an epoxy compound (not shown in FIG. 3). The capacitor structure 103, the oxygen and moisture barriers 115, 106, 119 and the resistor 113 form a film encapsulation 130, in particular, a thin film encapsulation, for protecting the light emission structure 102 against moisture and oxygen, wherein the capacitor structure 103 and the resistor 113 are integrated into the film encapsulation 130.

Figure 5:
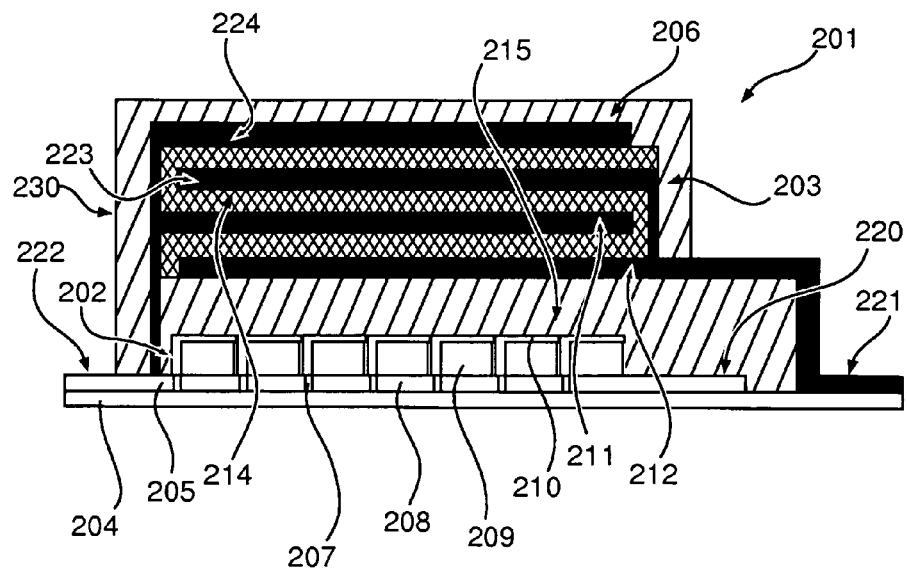
FIG. 5 shows a further embodiment of a bottom-emitting light apparatus, wherein the light apparatus comprises a capacitor structure having several capacitors.
Figure 6:
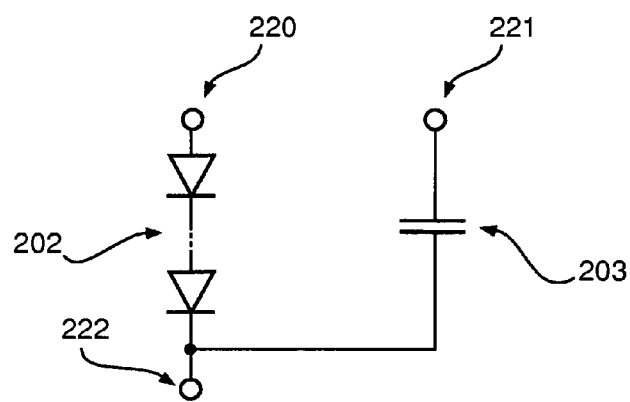
FIG. 6 shows schematically and exemplarily an equivalent circuit of the light apparatus shown in FIG. 5.

FIG. 5 shows schematically and exemplarily a further embodiment of a light apparatus. The light apparatus 201 shown in FIG. 5 is similar to the light apparatus 1 shown in FIG. 1, except for the capacitor structure 203 and the missing additional resistor. In particular, the light apparatus 201 comprises a substrate 204 precoated with a structured ITO layer 205 forming the bottom light emission electrodes 208. Moreover, also the light apparatus 201 comprises passive elements 207, top light emission electrodes 210, light emission materials 209, respectively sandwiched between pairs of bottom and top light emission electrodes 208, 210, wherein each light emission electrodes pair with the respective sandwiched light emission material can be regarded as forming an OLED, first and second moisture and oxygen barriers, 215, 206, and contact pads 220, 221, 222 for contacting the light apparatus to a voltage source. In this embodiment, the capacitor structure 203 comprises more than two capacitor electrode films 211, 212, 223, 224, which can also be regarded as being capacitor plates, wherein between these capacitor electrode films a dielectric film 214 is provided. The capacitor structure 203 is integrated in the light apparatus 201 such that the capacitor electrode films 211, 212, 223, 224 and the dielectric film 214 are arranged in parallel to the light emission structure 202. The conducting layers forming the capacitor plates may consist either of metals such as aluminium or silver or of transparent conductive oxides such as ITO or AZO, respectively. These conducting layers are deposited in such a way that they have electrical contact to the top light emission electrode ground. The ground light emission electrode contact pad 220 of the light emission structure 202 and the capacitor contact pad 221 are kept unconnected. In particular, in a three-dimensional drawing it would be visible that the connector 220 is not completely coated by the moisture and oxygen barrier 215 such that the connector 220 is still connectable. The dielectric layers are deposited such that they isolate the conducting capacitor plates 211, 212, 223, 224. The capacitor structure 203 and the moisture and oxygen barriers 215, 206 form a film encapsulation 230, in particular, a thin film encapsulation, wherein the capacitor structure 203 is integrated into the film encapsulation 230. FIG. 6 shows schematically and exemplarily an equivalent circuit of the light apparatus 201. As can be seen, the capacitor structure 203 is parallel to the light emission structure 202.

The light apparatus can be utilized by, for example, a one-stage offline driver or a two-stage offline driver, where the light apparatus can replace the need for an extra capacitor component for, for instance, flicker reduction. The utilization of the light apparatus 201 in a one-stage offline driver is schematically and exemplarily shown in FIG. 7.

Figure 7:
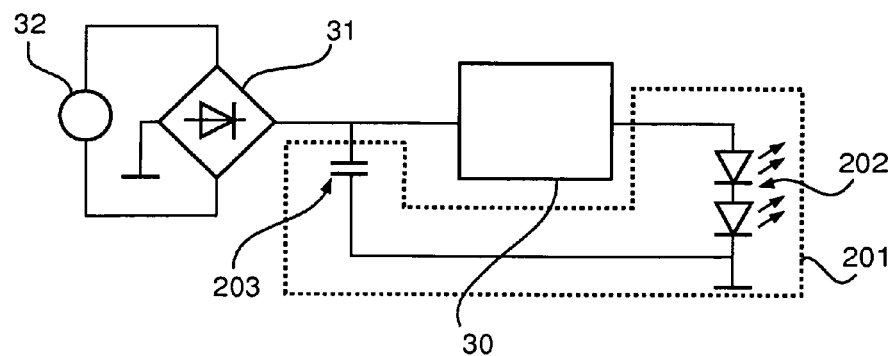
FIG. 7 shows schematically and exemplarily an embodiment of a one-stage mains driver utilizing the light apparatus shown in FIG. 5.
Figure 8:
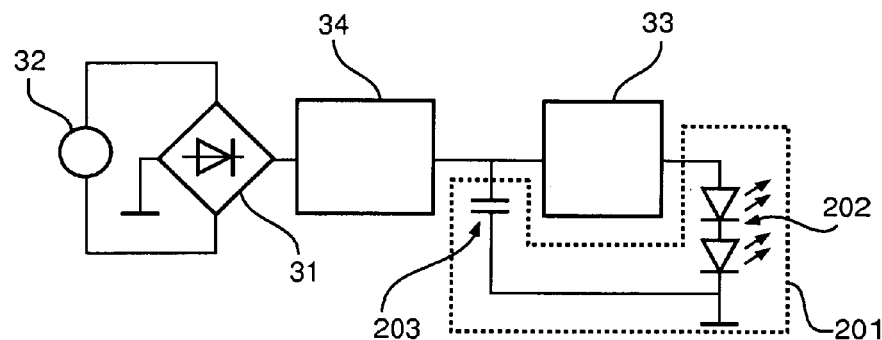
FIG. 8 shows schematically and exemplarily a two-stage mains driver utilizing the light apparatus shown in FIG. 5.

In FIG. 7, mains 32 are connected with a bridge rectifier 31 and a converter 30, in order to apply a relatively constant current to the light apparatus 201. FIG. 8 shows schematically and exemplarily the utilization of the light apparatus 201 in a two-stage offline driver.

In FIG. 8, mains 32 are connected to a bridge rectifier 31, a pre-conditioner 34 and a second stage 33. The pre-conditioner 34 is used to reduce the power factor of the power supply, in order to read power factor limitations based on existing and upcoming national rulings in various markets like EN 61000-3-2 or the Energy Star specifications.

Figure 9:
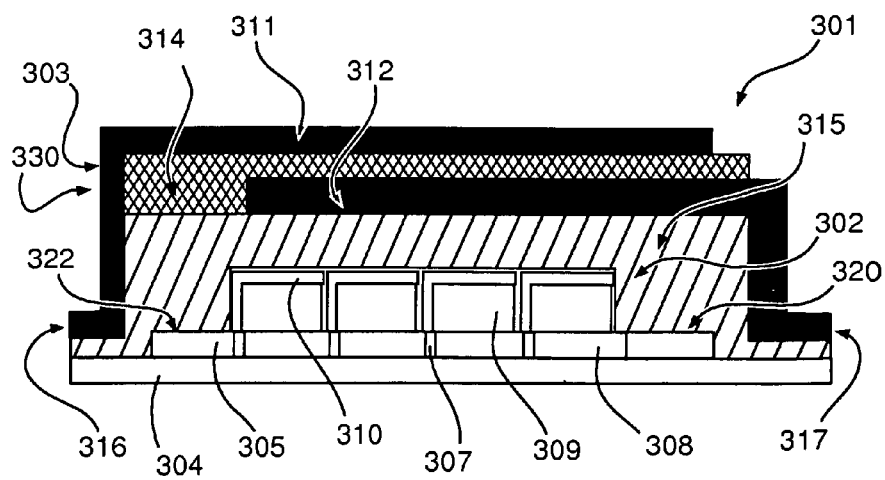
FIG. 9 shows a further embodiment of a bottom-emitting light apparatus, wherein the light apparatus comprises electrically separated light emission and capacitor structures.

FIG. 9 shows schematically and exemplarily a further embodiment of a light apparatus. The light apparatus 301 shown in FIG. 9 also comprises a substrate 304 coated with a structured ITO layer 305 for forming bottom light emission electrodes 308 separated by passive elements 307, wherein each bottom light emission electrode 308 forms together with a corresponding top light emission electrode 310 and light emission material 309 located between the respective bottom and top light emission electrodes 308, 310 an OLED and wherein the resulting series of OLEDs forms a light emission structure 302. This light emission structure 302 is covered by a moisture and oxygen barrier 315, wherein on top of the moisture and oxygen barrier 315 a capacitor structure 303 is provided. The capacitor structure 303 comprises capacitor electrode films 311, 312, which may also be regarded as being capacitor plates, and a dielectric film 314 arranged partly between the capacitor electrode films 311, 312. Also in this embodiment the capacitor structure 303 is integrated in the light apparatus 301 such that the capacitor electrode films 311, 312 and the dielectric film 314 are arranged in parallel to the light emission structure 302. The light apparatus 301 further comprises two contact pads 322, 320 for contacting the top and bottom light emission electrodes 310, 308, and capacitor contact pads 316, 317 for contacting the capacitor structure 303. The capacitor structure 303 is located on top of the encapsulation provided by the moisture and oxygen barrier 315, but electrically isolated. In this embodiment, the dielectric material forming the dielectric film 314 of the capacitor structure 303 can consist of any insulating material and can be different to the thin film encapsulation material used for providing the moisture and oxygen barrier 315. The capacitor structure 303 forms together with the moisture and oxygen barrier 315 a film encapsulation 330 for protecting the light emission structure 302 against moisture.

Figure 10:
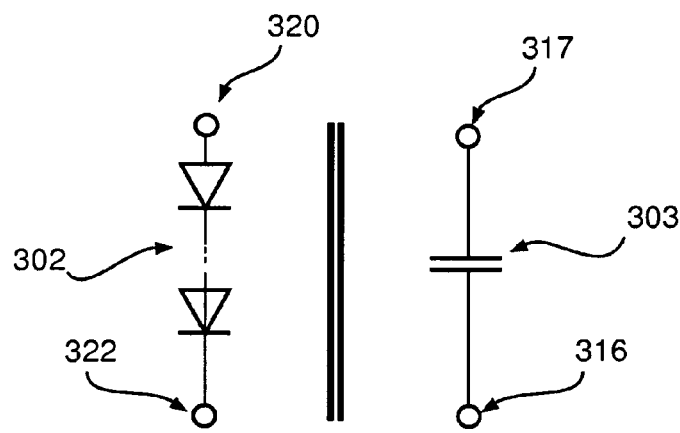
FIG. 10 shows schematically and exemplarily an equivalent circuit of the light apparatus shown in FIG. 9.

FIG. 10 shows schematically and exemplarily an equivalent circuit of the light apparatus 301 shown in FIG. 9. In particular, FIG. 10 illustrates that the circuit of the light emission structure 302 and of the capacitor structure 303 are electrically isolated.

Figure 11:
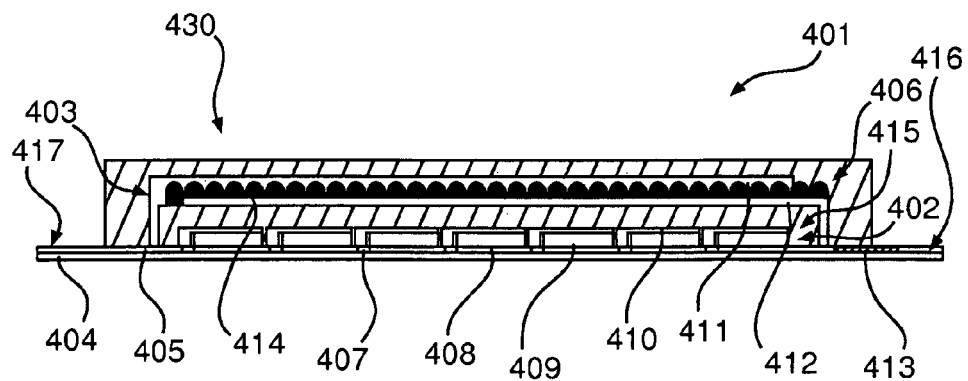
FIG. 11 shows a further embodiment of a light apparatus for generating light, wherein the light apparatus is a top-emitting light apparatus having a transparent capacitor structure.

FIG. 11 shows schematically and exemplarily a further embodiment of a light apparatus. The light apparatus 401 shown in FIG. 11 comprises a substrate 404 coated with a transparent conductive oxide 405, wherein the transparent conductive oxide 405 is structured for forming bottom light emission electrodes 408, which are separated by passive elements 407. Pairs of the bottom light emission electrodes 408 and top light emission electrodes 410 are provided, wherein each pair of these light emission electrodes 408, 410 sandwiches light emission material 409 for forming an OLED. Thus, several OLEDs are formed, which are electrically connected in series, thereby forming a light emission structure 402. The light emission structure 402 is covered by a moisture and oxygen barrier 415, and on top of the moisture and oxygen barrier 415 a capacitor structure 403 is provided. The capacitor structure 403 is encapsulated by a further, second moisture and oxygen barrier 406. The capacitor structure 403 comprises two capacitor electrode films 411, 412, which may also be regarded as being capacitor plates, and a dielectric film 414 between the capacitor electrode films 411, 412. The capacitor structure 403 is integrated in the light apparatus 401 such that the capacitor electrode films 411, 412 and the dielectric film 414 are arranged in parallel to the light emission structure 402. The light apparatus 401 further comprises a transparent conductive oxide resistor 413 and contact pads 416, 417. The dielectric film 414 is structured for influencing the light. For example, it can be curled or it can consist of particles embedded in a matrix system.

Figure 12:
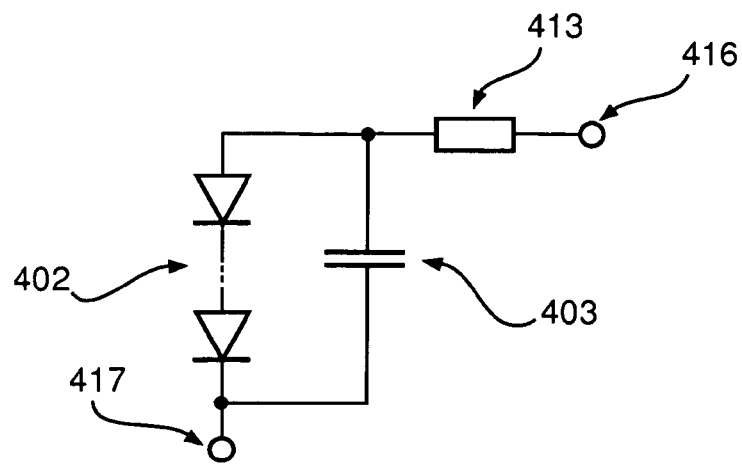
FIG. 12 shows schematically and exemplarily an equivalent circuit of the light apparatus shown in FIG. 11.

The light apparatus 401 shown in FIG. 11 is similar to the top emitting light apparatus described above with reference to FIG. 1, except for the circuitry and the design of the dielectric. The circuitry differs in that the optional resistor 413 is connected in series with the whole circuitry of the light emission structure 402 and the capacitor structure 403 as schematically and exemplarily illustrated in the equivalent circuit shown in FIG. 12. Moreover, the dielectric is not plane any more such that in an integrated solution a thin film based capacitor structure 403 is used as electric filter and also influences the optical characteristics of the outcoupling of the light out of the light, apparatus 401. Depending on the respective form of the dielectric film 414, light scattering and/or specific properties of a distributed bragg reflector can be favored, in order to modify the outcoupling efficiency or angular-dependent characteristics of the light emission as already realized in external outcoupling structures of known OLEDs. At the same time, the thickness and form of the dielectric film 414 has an impact on the dimension of the capacitor structure 403. A smaller thickness leads to a higher capacitance, but to lower breakdown voltages following the simplified picture of a parallel plate capacitor. The form of the dielectric film 414 also determines the capacitance density, because a curled dielectric film together with plane or curled capacitor electrode films lead to a larger surface compared to a parallel plate capacitor. The capacitor structure 403 and the further layers above the light emission structure 402 like the moisture and oxygen barriers 415, 406 form a film encapsulation 430 for encapsulating the light emission structure 402 against moisture. Also in this embodiment the capacitor structure 403 is integrated into the film encapsulation 430.

Figure 13:
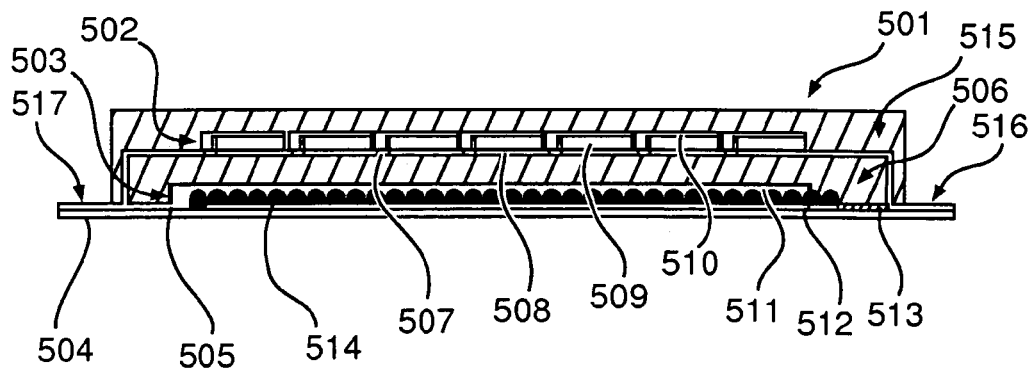
FIG. 13 shows schematically and exemplarily a further embodiment of a light apparatus for generating light, wherein the light apparatus is a bottom-emitting light apparatus comprising a transparent capacitor structure located below a light emission structure.

FIG. 13 shows schematically and exemplarily a further embodiment of a light apparatus. The light apparatus 501 shown in FIG. 13 comprises a substrate 504 coated with a transparent conductive oxide 505 forming a bottom capacitor electrode film 512. On the capacitor electrode film 512 a dielectric film 514 is provided, wherein the dielectric film 514 is structured, for instance, curled. On top of the dielectric film 514 a conductive layer 511 is provided forming a top capacitor electrode film. The capacitor electrode films 511, 512 and the dielectric film 514 form a capacitor structure 503. The capacitor structure 503 is encapsulated by a moisture and oxygen barrier 506 and on top of the moisture and oxygen barrier 506 a light emission structure 502 is provided. The light emission structure 502 in turn is also covered by a moisture and oxygen barrier 515, which can be regarded as being a film encapsulation. The light emission structure 502 comprises pairs of bottom light emission electrodes 508 and top light emission electrodes 510 sandwiching light emission material 509. Each pair of light emission electrodes and sandwiched light emission material forms an OLED, wherein the OLEDs are connected in series. Also in this embodiment the capacitor structure 503 is integrated in the light apparatus 501 such that the capacitor electrode films 511, 512 and the dielectric film 514 are arranged in parallel to the light emission structure 502.

The light apparatus 501 is a bottom emitting light apparatus, wherein the light emission structure 502 is located on top of the capacitor structure 503, wherein the capacitor structure 503 is at least partly transparent to the emitted light for allowing the light to leave the light apparatus 501 through the capacitor structure 503, whereby the capacitor structure 503 influences the light and wherein the bottom light emission electrodes 508 are at least partly transparent to the emitted light. The top light emission electrodes 510 are opaque.

Figure 14:
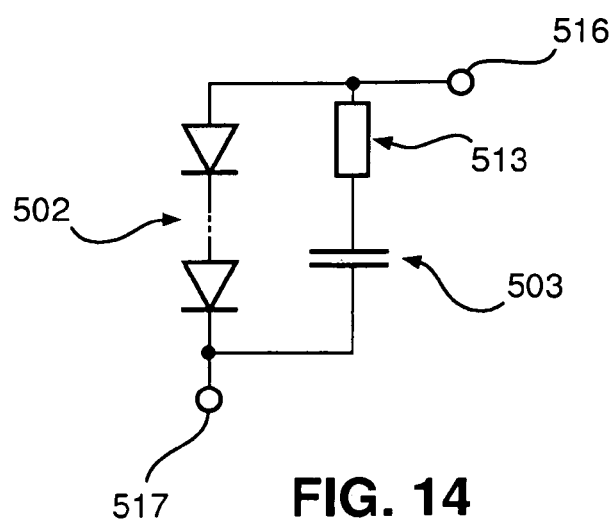
FIG. 14 shows schematically and exemplarily an equivalent circuit of the light apparatus shown in FIG. 13.

In FIG. 13, the thin film based capacitor structure 503 is deposited directly on the transparent substrate 504 and is encapsulated by a thin film 506 forming an oxygen and moisture barrier. On this film 506 the structured bottom light emission electrodes 508 with elements of passive lacquer, i.e. passive elements 507, defining active areas of the OLEDs can be precoated independently from the actual OLED process. Consequently, such precoated substrates could simplify the processing of the OLED devices with less effort and less stress applied on the organic material of the OLED stack forming the light emission material 509. Hence, a transparent OLED light apparatus with a thin film based capacitor structure can be processed either with a capacitor structure deposited on top of the light emission structure as indicated, for instance, in FIG. 1 or the other way around as indicated, for instance, in FIG. 13. The resistor 513 being a transparent conductive oxide resistor is connected in series with the capacitor structure 503 as schematically and exemplarily indicated in the equivalent circuit shown in FIG. 14. In FIGS. 13 and 14 reference numbers 516, 517 indicate contact pads for contacting the light apparatus.

In a further embodiment, the light apparatus shown in FIG. 13 comprises a reflective bottom capacitor electrode film, wherein the elements above the bottom capacitor electrode film are at least partly transparent to the emitted light. Thus, the light apparatus can be a top emitting light apparatus, wherein the light emission structure is located on top of the capacitor structure, wherein a bottom capacitor electrode film is adapted to reflect the emitted light towards the top of the light apparatus, wherein the capacitor structure is at least partly transparent to the emitted light above the bottom capacitor electrode film and wherein the light emission electrodes are at least partly transparent to the emitted light. The idea of substrates precoated with a thin film based capacitor structure can therefore also be applied to top emitting OLEDs by using an opaque metal electrode for the bottom contact of the capacitor structure.

Since the outcoupling structure, namely the capacitor structure, is embedded within a microcavity structure formed by all the layers together beginning from the bottom capacitor electrode film and ending by the outer thin film of the light apparatus on the top, the light outcoupling will be significantly influenced by the capacitor structure, in particular, by the thickness and the design of the dielectric film of the capacitor structure.

Figure 15:
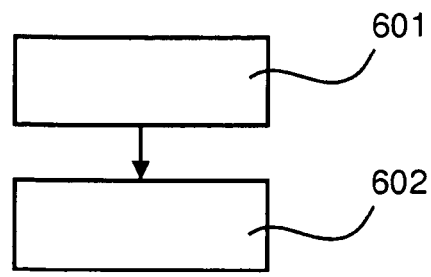
FIG. 15 shows a flowchart exemplarily illustrating an embodiment of a light method for generating light.

In the following a light method for generating light by using at least one of the above described light apparatuses will exemplarily be described with reference to a flowchart shown in FIG. 15.

In step 601, a voltage is applied to light emission material between at least two light emission electrodes via the light emission electrodes, wherein a capacitor structure including at least two capacitor electrode films and a dielectric film between the capacitor electrode films reduces possible fluctuations of the applied voltage, wherein the capacitor structure is integrated in the light apparatus such that the capacitor electrode films and the dielectric film are at least partly arranged in parallel to the light emission structure and wherein at least the light emission material is encapsulated by at least one film for providing a film encapsulation protecting at least the light emission material.

In step 602, light is emitted by the light emission material in response to the applied voltage.

Figure 16:
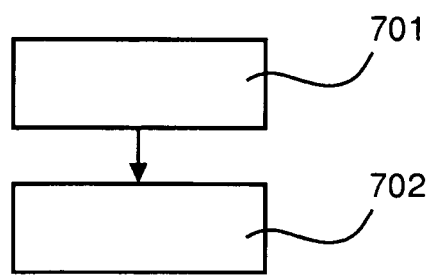
FIG. 16 shows a flowchart exemplarily illustrating a manufacturing method for manufacturing a light apparatus for generating light.
Figure 17:
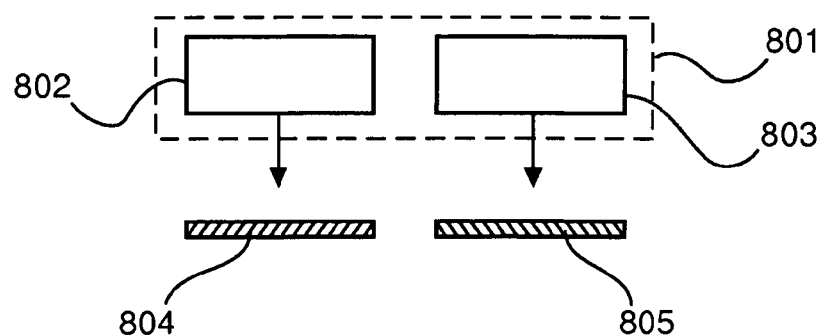
FIG. 17 shows schematically and exemplarily an embodiment of a manufacturing apparatus for manufacturing a light apparatus for generating light.

In the following a manufacturing method for manufacturing a light apparatus for generating light will exemplarily be described with reference to the flowchart shown in FIG. 16 and with reference to a manufacturing apparatus schematically and exemplarily shown in FIG. 17.

The manufacturing apparatus 801 comprises a light emission structure providing unit 802 for providing a light emission structure including at least two light emission electrodes and a light emission material arranged between the light emission electrodes, wherein the light emission material is adapted to emit light, if a voltage is applied to the light emission electrodes. Thus, in step 701 the light emission structure providing unit 802 provides the light emission material and the top light emission electrodes on a substrate coated with a conductive layer forming the bottom light emission electrodes for forming the light emission electrode pairs sandwiching the respective light emission material, thereby generating a series of light emitting diodes, in particular, of OLEDs. The resulting intermediate product is indicated by reference number 804. In step 702, a film encapsulation and capacitor structure providing unit 803 deposits several thin films on the light emission structure, in order to provide a film encapsulation with an integrated capacitor structure such that the capacitor structure is formed by films, in particular, thin films, of the film encapsulation. The capacitor structure is provided in a way that it is integrated in the light apparatus such that capacitor electrode films and a dielectric film between the capacitor electrode films are at least partly arranged in parallel to the light emission structure. The resulting light apparatus is indicated by reference number 805 in FIG. 17.

Manufacturing steps like the deposition of certain layers performed by one or several units or devices can be performed by any other number of units or devices. For example, steps 701 and 702 can be performed by a single unit or by any other number of different units, or the deposition of the several films for forming the film encapsulation and the capacitor structure, wherein the capacitor structure is preferentially integrated in the film encapsulation, can be performed by different units or devices depositing the different films. The control of the manufacturing apparatus in accordance with the manufacturing method can be implemented as program code means of a computer program and/or as dedicated hardware.

Figure 18:
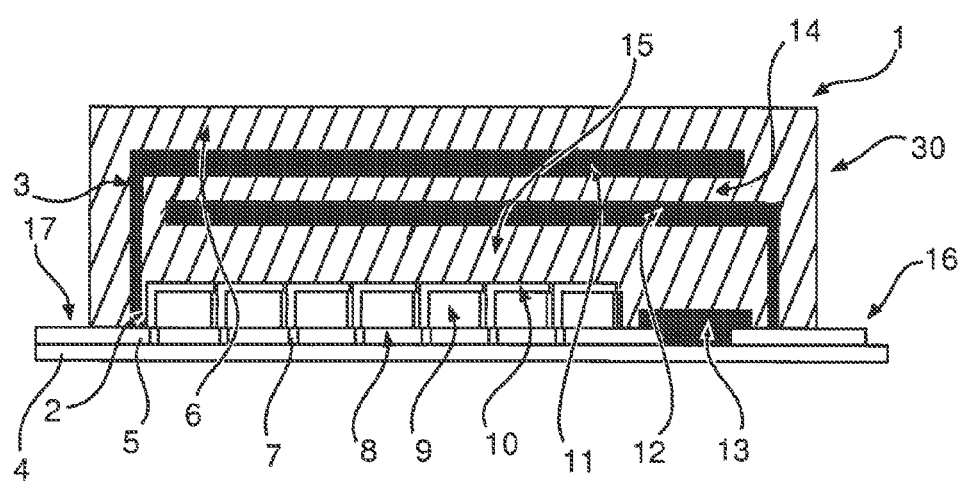
FIG. 18 shows schematically and exemplarily an embodiment of a capacitor structure formed by film encapsulation.

The embodiments of the light apparatuses described above with reference to the figures comprise a combination of OLEDs on a substrate, thin film encapsulation of OLEDs and thin film based capacitors and optionally resistors, wherein the thin film based capacitors and optionally the resistors may be integrated with the thin film encapsulation. A thin film as a moisture and oxygen barrier is preferentially used as a first dielectric on the top contacts of the OLEDs followed by a capacitor plate, i.e. followed by a capacitor electrode film, wherein preferentially the same material is used for the dielectric of the capacitor structure and the thin film moisture and oxygen barrier as exemplarily shown in FIG. 18.

The embodiments of the light apparatus described above with reference to the figures allow to replace a bulky capacitor, which may be used for filter and/or storage purposes, in known light apparatuses. The embodiments allow saving costs and maintaining the form factor of OLED devices, i.e, they allow creating thin driver solutions. Preferentially, additional components, functional organic light emitting layers and/or additional thin film substrates are not required. The light apparatus can comprise a single OLED or a series or parallel circuit of OLEDs deposited onto a solid substrate like glass or a flexible substrate like a polymer foil, which is precoated with a transparent conductive oxide. The transparent conductive oxide can be, for instance, ITO or AZO as bottom light emission electrode for the respective OLED and as conducting material for further connections.

The OLEDs pixel shape is defined by a passivation lacquer forming passive elements. The OLED circuit, i.e. the light emission structure, is protected against atmospheric components such as moisture and oxygen by the moisture and oxygen barrier. The moisture and oxygen barrier can be provided by thin film layers consisting of, for instance, $Al_2O_3$ and $ZrO_2$, called nanolaminate. The same thin film layers can be used as dielectric film of the capacitor structure. Thus, the nano laminate, $Al_2O_3$ or another dielectric material can be used as a dielectric for the capacitor structure and as an encapsulation layer to protect the light emission structure against moisture and oxygen.

In above described embodiments the light apparatus provides an integration of thin film based capacitors together with thin film based resistors in thin film encapsulated devices like OLEDs. The capacitor and/or resistor structures can be integrated on top of or beneath the thin film encapsulated device, i.e. on top or beneath the light emission structure with the moisture and oxygen barrier. The integration can be related to one or several capacitors and/or resistors, which can be connected with each other and with the thin film encapsulated device to arbitrary circuits.

The thin films, in particular, the thin films used as protection against moisture and oxygen, can consist of a neat layer of oxide or nitride like $Al_2O_3$, $ZrO_2$, $TiO_2$, $SiO_2$, SiN, et cetera or a combination of them as nanolaminates. The encapsulation preferentially acts as electrical insulator and protects the encapsulated device against moisture and oxygen. The thin film encapsulation can be processed by ALD, PALD, CVD, PECVD, sputtering and other PVD techniques. The dielectric, i.e. the dielectric film, of the capacitor structure can consist of a neat layer of oxide or nitride or organic like $Al_2O_3$, $ZrO_2$, $TiO_2$, $SiO_2$, SiN, pentacen, et cetera or a combination of them exhibiting a high permittivity, a high breakdown voltage and a compact layer structure. Also the dielectric can be obtained by ALD, PALD, CVD, PECVD, sputtering and other PVD techniques. The dielectric can also be obtained by thermal evaporation spin-coating and other printing methods. For the benefit of a lower complexity, the dielectric and the thin film encapsulation can be obtained by using the same method and by using the same material system.

Moreover, in above described embodiments the light apparatus comprises a combination of thin film encapsulated OLEDs on a substrate with a thin film based capacitor structure and optionally resistors as electric filter elements and as outcoupling structures. Particularly, the usage of the thin film based capacitor structure as integrated outcoupling structure reduces the size of the light apparatus. Moreover, using a specifically structured material as dielectric of the capacitor structure increases the capacitance and concomitantly modifies the light emission characteristics of the light apparatus. Thus, the capacitor structure can function as electric filter element reducing the perceptible light modulation, i.e. reducing flickering, and modifying the outcoupling efficiency and angular-dependent characteristics, thereby maintaining minimum space requirements and thin form factors. In particular, since a thin film based capacitor structure is integrated into OLED devices, bulky filter elements of prior art OLED devices can be substituted and the functionality of the capacitor structure can be upgraded by arranging the capacitor structure on top or below the light emission structure, wherein transparent, in particular, semi-transparent, electrodes can be used for the capacitor structure and wherein the thicknesses of these capacitor electrodes, the thickness of the dielectric layer, the thickness of the OLED stack, i.e. the thickness of the light emission material, the thickness of the light emission electrodes and/or the thickness of the thin film encapsulation can be adjusted to influence the microcavity structure determining the properties of the outcoupling of the light as desired. The light apparatus does therefore not necessarily need additional outcoupling structures; thereby reducing the efforts for manufacturing the OLED devices and thereby allowing for a thin form factor of OLED solutions.

The capacitor structure can comprise several capacitors deposited onto each other to increase the capacitance or the breakdown voltage, and, concomitantly, to act as out-coupling structures. The capacitor structure can exhibit two transparent electrodes or one transparent and one opaque and reflecting metal electrode depending on the design of the OLEDs as bottom or top emitter or as transparent devices. The transparent electrodes of the capacitor can be transparent electrode films comprising transparent conductive oxides like ITO, AZO, et cetera, multilayer electrodes with ultra thin metal films like ITO/Ag/ITO, ZTO/AL/CTO, et cetera, semi-transparent thin metal films like Ag, Au, Al, et cetera, or a combination of these materials. The dielectric film and the electrode films of the capacitor can be plane or curled and the dielectric film can be homogeneous or can consist of particles embedded in a matrix system. The dielectric of the capacitor structure can be made of transparent oxides or nitrides realizing a high permittivity, a high breakdown voltage and a compact layer structure with impact on light outcoupling. In particular, it can be made of $Al_2O_3$, $SiO_2$, $TiO_2$, TaO, other oxides or nanolaminates of these materials like $Al_2O_3/TiO_2$. Alternatively or in addition, the dielectric can comprise organic materials, like polymers embedding oxide particles like $TiO_2$ and $CeO_2$ for light scattering. The polymers can be high-index polymers. The dielectric can also comprise organic small molecules.

The thin film encapsulation can be separately processed on top of the light emission structure and on top of the capacitor structure and/or the resistor. The dielectric and the transparent electrodes can be obtained by ALD, PALD, CVD, PECVD, sputtering and other PVD techniques as well as by thermal evaporation, spin-coating, other printing methods and a combination of these techniques.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a light apparatus for generating light. The light apparatus comprises a light emission structure including light emission material, a capacitor structure including at least two capacitor electrode films and a dielectric film between the capacitor electrode films, and a film encapsulation including at least one film for encapsulating and thereby protecting at least the light emission material. The capacitor structure is integrated in the light apparatus such that the capacitor electrode films and the dielectric film are at least partly arranged in parallel to the light emission structure. Since films, in particular, thin films, are used for the capacitor structure and the encapsulation and since the capacitor structure is integrated in the light apparatus, the light apparatus can be relatively thin.

The invention claimed is:

1. A light apparatus for generating light, the light apparatus comprising:
    a light emission structure including at least two light emission electrodes and a light emission material arranged between the light emission electrodes, wherein the light emission material is arranged to emit an emitted light, if a voltage is applied to the light emission electrodes,
    a capacitor structure including at least two capacitor electrode films and a dielectric film between the capacitor electrode films wherein the capacitor electrode films and the dielectric film are at least partly in parallel to the light emission structure, and
    a film encapsulation comprising at least one film,
        wherein the at least one film encapsulates at least the light emission material,
        wherein at least a portion of the capacitor structure is formed by the film encapsulation.

2. The light apparatus as defined in claim 1, wherein the dielectric film comprises an oxide.

3. The light apparatus as defined in claim 1, wherein the film encapsulation comprises a first moisture and oxygen barrier.

4. The light apparatus as defined in claim 3, wherein the first moisture and oxygen barrier and the dielectric film are made of the same material.

5. The light apparatus as defined in claim 1, wherein the film encapsulation further comprises a second moisture and oxygen barrier.

6. The light apparatus as defined in claim 5, wherein the second moisture and oxygen barrier and the dielectric film comprise the same material.

7. The light apparatus as defined in claim 1, wherein the light apparatus further comprises a resistor electrically connected to the light emitting structure and to the capacitor structure.

8. The light apparatus as defined in claim 1, wherein the capacitor structure is arranged to influence the emitted light.

9. The light apparatus as defined in claim 8, wherein the capacitor structure is partly transparent to the emitted light and wherein the light apparatus is arranged such that the emitted light strikes at least a part of the transparent capacitor structure before leaving the light apparatus.

10. The light apparatus as defined in claim 8, wherein at least one of the capacitor electrode films is arranged to influence the emitted light.

11. The light apparatus as defined in claim 1, wherein the dielectric film comprises a nitride.

12. The light apparatus as defined in claim 8, wherein the dielectric film is arranged to influence the emitted light.

* * * * *